United States Patent
Chong et al.

(10) Patent No.: US 8,847,626 B1
(45) Date of Patent: Sep. 30, 2014

(54) CIRCUITS AND METHODS FOR PROVIDING CLOCK SIGNALS

(71) Applicant: Altera Corporation, San Jose, CA (US)

(72) Inventors: Yan Chong, San Jose, CA (US); Warren Nordyke, Cupertino, CA (US); Pradeep Nagarajan, San Jose, CA (US); James Kimble Lin, Campbell, CA (US); Weiqi Ding, Fremont, CA (US)

(73) Assignee: Altera Corporation, San Jose, CA (US)

( * ) Notice: Subject to any disclaimer, the term of this patent is extended or adjusted under 35 U.S.C. 154(b) by 41 days.

(21) Appl. No.: 13/839,282

(22) Filed: Mar. 15, 2013

(51) Int. Cl.
*H03K 19/00* (2006.01)
*H03K 19/173* (2006.01)

(52) U.S. Cl.
CPC .................................. *H03K 19/1737* (2013.01)
USPC .................................. 326/93; 326/38; 326/21

(58) Field of Classification Search
USPC ..................................... 326/21, 37, 38, 93–98
See application file for complete search history.

(56) References Cited

U.S. PATENT DOCUMENTS

| 7,555,670 | B2* | 6/2009 | Mohanavelu et al. | 713/600 |
| 7,791,370 | B1 | 9/2010 | Hoang et al. | |
| 2005/0231399 | A1* | 10/2005 | Fowler et al. | 341/100 |
| 2013/0285725 | A1* | 10/2013 | Bui et al. | 327/175 |

OTHER PUBLICATIONS

Altera Corporation, "Arria II Device Handbook vol. 1: Device Interfaces and Integration," Chp. 8, "High-Speed Differential I/O Interfaces and DPA in Arria II Devices," Jul. 2012, pp. 1-38.
Altera Corporation, "Arria V Device Handbook vol. 1: Device Interfaces and Integration," Chp. 7, "External Memory Interfaces in Arria V Devices," Jun. 2012, pp. 1-28.

* cited by examiner

*Primary Examiner* — Don Le
(74) *Attorney, Agent, or Firm* — Steven J. Cahill

(57) ABSTRACT

A circuit includes first and second bidirectional clock networks and first and second clock signal generation circuits. A first multiplexer circuit is configurable to provide a first clock signal from a first pin to the first bidirectional clock network. A second multiplexer circuit is configurable to provide the first clock signal from the first bidirectional clock network to the second bidirectional clock network. Third multiplexer circuits are configurable to provide the first clock signal from the second bidirectional clock network to the first and the second clock signal generation circuits.

21 Claims, 8 Drawing Sheets

CIRCUITS AND METHODS FOR PROVIDING CLOCK SIGNALS

FIELD OF THE DISCLOSURE

The present disclosure relates to electronic circuits, and more particularly, to circuits and methods for providing clock signals.

BACKGROUND

A programmable logic integrated circuit, such as a field programmable gate array (FPGA), may include one or more memory interfaces. Each memory interface can receive and transmit data signals between an external memory device in response to one or more clock signals. At higher data rates of the data signals, jitter, duty cycle distortion, and skew in the clock signals have a more negative impact on the performance of the memory interface.

BRIEF SUMMARY

According to some embodiments, a circuit includes first and second bidirectional clock networks and first and second clock signal generation circuits. A first multiplexer circuit is configurable to provide a first clock signal from a first pin to the first bidirectional clock network. A second multiplexer circuit is configurable to provide the first clock signal from the first bidirectional clock network to the second bidirectional clock network. Third multiplexer circuits are configurable to provide the first clock signal from the second bidirectional clock network to the first and the second clock signal generation circuits.

Various objects, features, and advantages of the present invention will become apparent upon consideration of the following detailed description and the accompanying drawings.

DETAILED DESCRIPTION

According to some embodiments described herein, a clock circuit provides clock signals to interface circuits. The clock circuit is coupled to multiple clock signal generation circuits. The clock signal generation circuits may be, for example, phase-locked loops or delay-locked loops. The clock circuit includes one or more bidirectional clock networks that can provide a clock signal from a clock pin to one or more of the clock signal generation circuits. The one or more bidirectional clock networks may provide the same delay to the clock signal as the clock signal is transmitted to each of the clock signal generation circuits. The clock signal may have the same phase as received at each of the clock signal generation circuits.

Each of the clock signal generation circuits is in an input/output (IO) pack. Each IO pack may include a clock signal generation circuit and one or more interface circuits. The clock circuit also includes one or more clock networks in each IO pack. The one or more clock networks in an IO pack provide one or more output clock signals of the clock signal generation circuit in that IO pack to the one or more interface circuits in that IO pack. In some embodiments described herein, the clock networks in an IO pack provide output clock signals of a clock signal generation circuit in that IO pack only to the interface circuits in that IO pack.

The clock circuit may provide a shorter delay to the clock signals provided to the interface circuits, which can improve the performance of the interface circuits. The clock circuit may provide the same delay or substantially the same delay to the clock signals provided to the interface circuits in one or more IO packs.

Figure 1:
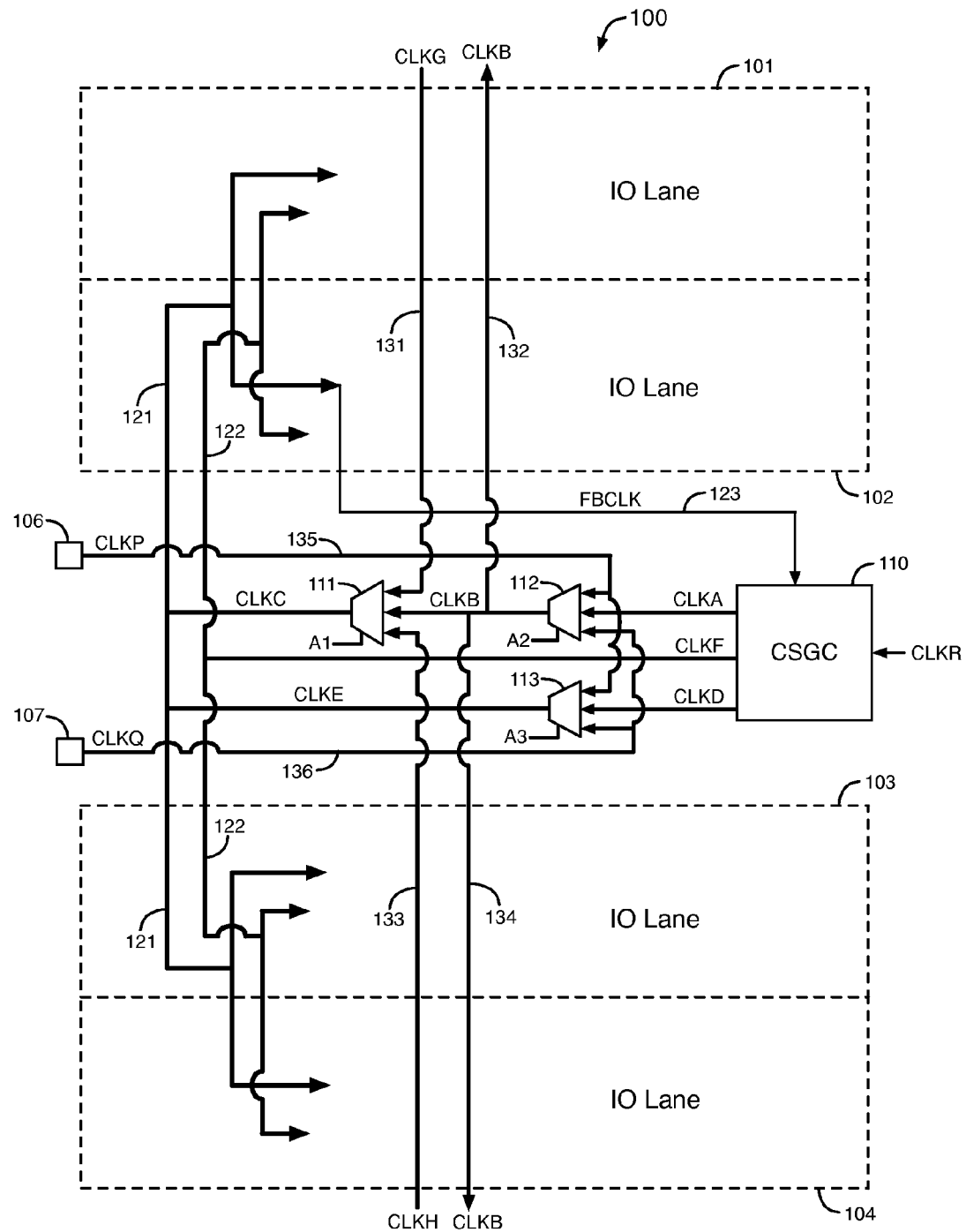
FIG. 1 illustrates an example of an input/output (IO) pack, according to an embodiment of the present invention.

FIG. 1 illustrates an example of an input/output (IO) pack 100, according to an embodiment of the present invention. IO pack 100 includes four input/output (IO) lanes 101-104, clock pins 106-107, clock signal generation circuit (CSGC) 110, multiplexer circuits 111-113, unidirectional clock networks 121-122, and conductors 131-136. Clock signal generation circuit (CSGC) 110 may be, for example, a phase-locked loop (PLL) circuit or a delay-locked loop (DLL) circuit. IO pack 100 includes an input/output interface on an integrated circuit. The integrated circuit may be, for example, a field programmable gate array (FPGA) or an application specific integrated circuit.

Clock signal generation circuit (CSGC) 110 generates a first set of clock signals CLKA, a second set of clock signals CLKD, and a third set of clock signals CLKF in response to an input reference clock signal CLKR. Clock signals as described herein are periodic signals. Clock signals CLKA are provided to first multiplexing inputs of multiplexer circuit 112. Clock signals CLKA may include any number of one or more clock signals.

Clock pins 106 include one, two, or more external terminals of the integrated circuit. One, two, or more clock signals CLKP are transmitted from one or more external devices through clock pins 106 and conductors 135 to second multiplexing inputs of multiplexer circuit 112 during the operation of IO pack 100. Clock pins 107 include one, two, or more external terminals of the integrated circuit. One, two, or more clock signals CLKQ are transmitted from one or more external devices through clock pins 107 and conductors 136 to third multiplexing inputs of multiplexer circuit 112 during the operation of IO pack 100. Multiplexer circuit 112 selects clock signals CLKA, clock signals CLKP, or clock signals CLKQ as selected clock signals based on select signals A2 and provides the selected clock signals to its outputs as clock signals CLKB. As an example that is not intended to be limiting, multiplexer circuit 112 may generate two output clock signals CLKB based on two clock signals CLKA, based on two clock signals CLKP, or based on clock signals CLKQ.

Figure 3:
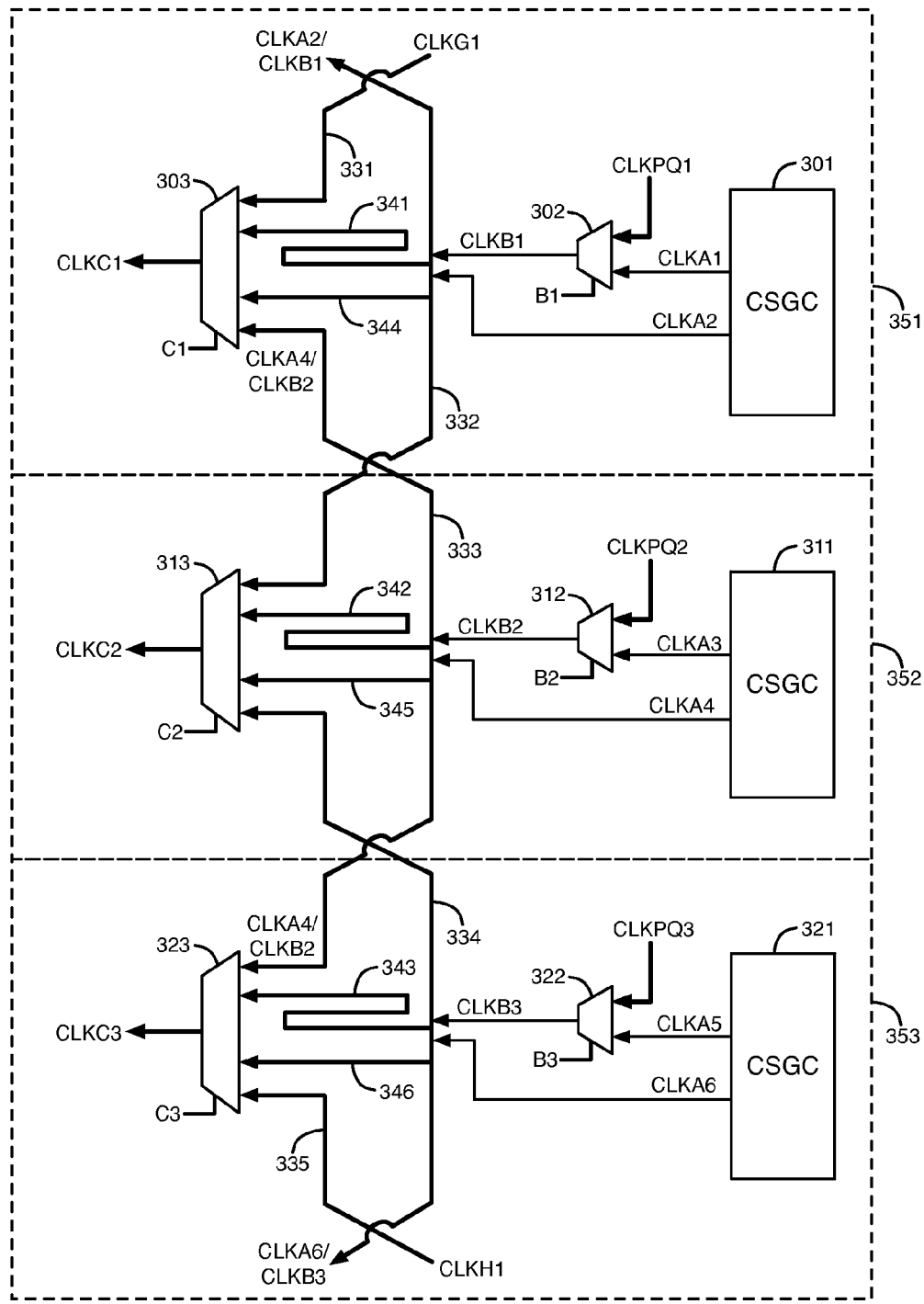
FIG. 3 illustrates examples of clock networks that are operable to transmit clock signals between multiple input/output (IO) packs, according to an embodiment of the present invention.

Clock signals CLKG and clock signals CLKH are generated by IO packs that are adjacent to IO pack 100, as described in further detail with respect to FIG. 3. Clock signals CLKB are provided to the adjacent IO packs through conductors 132 and 134. Clock signals CLKG and CLKH are provided to multiplexer circuit 111 through conductors 131 and 133, respectively. Clock signals CLKG, clock signals CLKB, and clock signals CLKH are provided to multiplexing inputs of multiplexer circuit 111. Multiplexer circuit 111 selects clock signals CLKB, clock signals CLKG, or clock signals CLKH as selected clock signals based on select signals A1 and provides the selected clock signals to its outputs as clock signals CLKC in clock network 121. As an example that is not intended to be limiting, multiplexer circuit 111 may generate two output clock signals CLKC based on two clock signals CLKB, based on two clock signals CLKG, or based on two clock signals CLKH. Clock signals CLKC are provided through clock network 121 to each of the IO lanes 101-104.

Clock network 121 includes conductor 123. One of clock signals CLKC is a feedback clock signal that is referred to as clock signal FBCLK herein. Clock signal FBCLK is fed back from multiplexer circuit 111 through conductor 123 in clock network 121 to a feedback input of CSGC 110, as shown in FIG. 1. In an embodiment, CSGC 110 is a phase-locked loop that is programmed to compare the phase and frequency of feedback clock signal FBCLK to the phase and frequency of clock signal CLKR to generate a phase error value that is used to set the phases and frequencies of output clock signals CLKA, CLKD, and CLKF.

Clock signals CLKD are provided to first multiplexing inputs of multiplexer circuit 113. Clock signals CLKD may include any number of one or more clock signals. One, two, or more clock signals CLKP are transmitted from one or more external devices through clock pins 106 and conductors 135 to second multiplexing inputs of multiplexer circuit 113. One, two, or more clock signals CLKQ are transmitted from one or more external devices through clock pins 107 and conductors 136 to third multiplexing inputs of multiplexer circuit 113.

Multiplexer circuit 113 selects clock signals CLKD, clock signals CLKP, or clock signals CLKQ as selected clock signals based on select signals A3 and provides the selected clock signals to its outputs as clock signals CLKE in clock network 121. As an example that is not intended to be limiting, multiplexer circuit 113 may generate three output clock signals CLKE based on three clock signals CLKD, based on three clock signals CLKP, or based on three clock signals CLKQ. Clock signals CLKE are provided through clock network 121 to each of the IO lanes 101-104.

Each of the clock signals CLKC and each of the clock signals CLKE is provided through a separate set of one or more conductors in clock network 121 to each of the IO lanes 101-104. For example, if clock signals CLKC and CLKE together include exactly 5 clock signals, then clock network 121 includes 5 sets of conductors. The conductors in each set of conductors are coupled together to transmit one of clock signals CLKC and CLKE to IO lanes 101-104. Each set of conductors in clock network 121 may be, for example, a clock tree. The conductors in each set of conductors are not connected to any of the other sets of conductors that transmit the other clock signals. Clock network 121 provides the same delay to each clock signal CLKC as the clock signal is transmitted from multiplexer circuit 111 to each of IO lanes 101-104. Clock network 121 provides the same delay to each clock signal CLKE as the clock signal is transmitted from multiplexer circuit 113 to each of IO lanes 101-104. Clock network 121 maintains the same phase relationships between clock signals CLKC and between clock signals CLKE.

Clock signals CLKF generated by CSGC 110 are provided through conductors in clock network 122 to each of the IO lanes 101-104. Each of the clock signals CLKF is provided through a separate set of one or more conductors in clock network 122 to each of the IO lanes 101-104. For example, if clock signals CLKF include exactly 8 clock signals, then clock network 122 includes 8 sets of conductors. The conductors in each set of conductors are coupled together to transmit one of clock signals CLKF to IO lanes 101-104. The conductors in each set of conductors are not connected to any of the other sets of conductors that transmit the other clock signals. Each set of conductors in clock network 122 may be, for example, a clock tree. Clock network 122 provides the same delay to each clock signal CLKF as the clock signal is transmitted from CSGC 110 to each of IO lanes 101-104.

Figure 2:
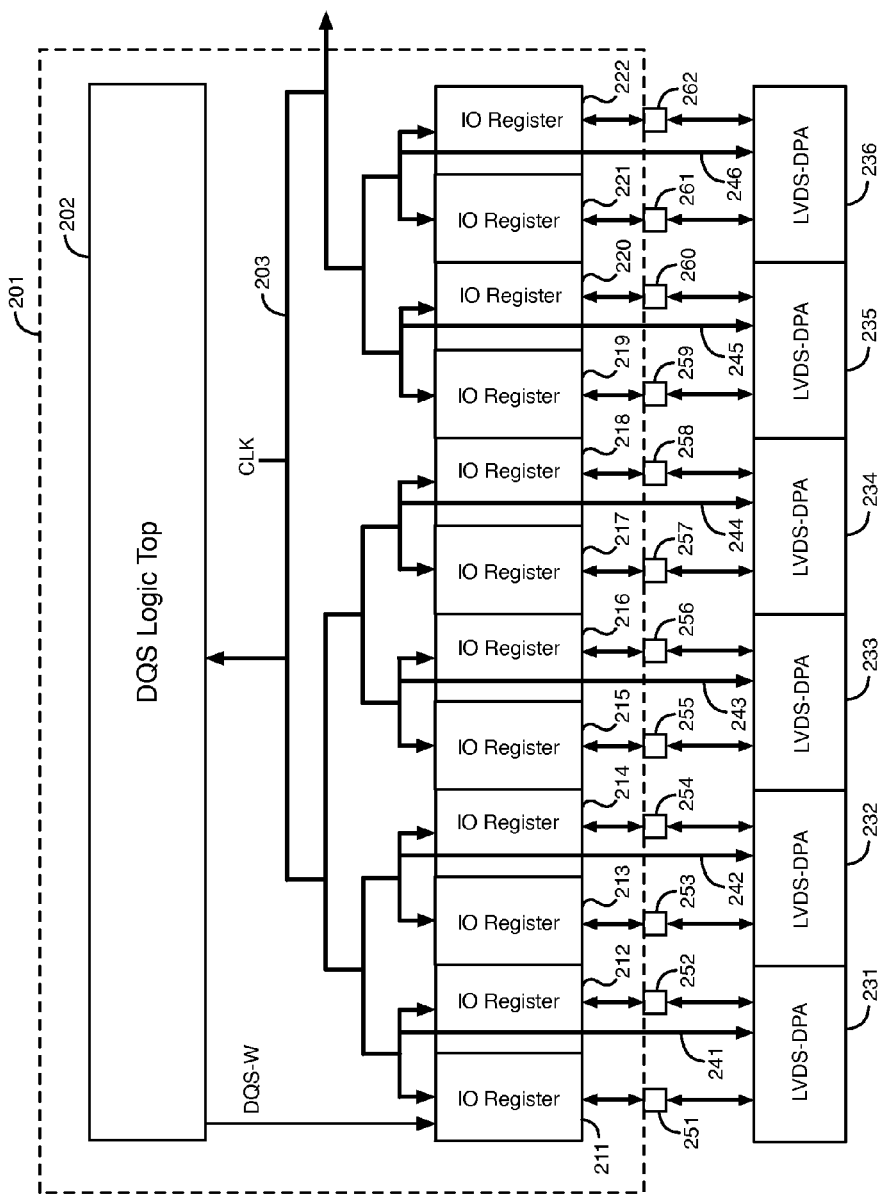
FIG. 2 illustrates an example of an input/output (IO) lane, according to an embodiment of the present invention.

FIG. 2 illustrates an example of an input/output (IO) lane 201, according to an embodiment of the present invention. IO lane 201 is an example of each of the input/output (IO) lanes 101-104 shown in FIG. 1. In an embodiment, each of the IO lanes 101-104 includes an instance of IO lane 201.

IO lane 201 includes a memory interface circuit. The memory interface circuit is operable to transmit signals to and from an external memory device (e.g., at a single data rate, double data rate, quad data rate, etc.). The memory interface circuit in IO lane 201 includes DQS logic top circuit 202, clock network 203, and 12 input/output (IO) register circuits 211-222. FIG. 2 also illustrates 12 pins 251-262 and 6 low voltage differential signaling and dynamic phase alignment (LVDS-DPA) circuits 231-236. In the embodiment of FIG. 2, LVDS-DPA circuits 231-236 are not part of IO lane 201, but are part of the IO pack. Pins 251-262 are external terminals of the integrated circuit. Each of the 12 boxes with reference numerals 251-262 in FIG. 2 may represent one or more pins.

In FIG. 2, clock signals CLK are transmitted through clock network 203. In one embodiment, clock network 203 is an example of clock network 121, and clock signals CLK in FIG. 2 are clock signals CLKC and CLKE shown in FIG. 1. In another embodiment, clock network 203 is an example of clock network 122, and clock signals CLK in FIG. 2 are clock signals CLKF in FIG. 1.

One or more clock signals CLK are transmitted through conductors in clock network 203 to each of IO register circuits 211-222. One or more clock signals CLK are transmitted through conductors in clock network 203 to each of LVDS-DPA circuits 231-236. Conductors 241-246 in clock network 203 are coupled to provide one or more clock signals CLK to LVDS-DPA circuits 231-236, respectively. One or more clock signals CLK are transmitted through conductors in clock network 203 to inputs of DQS logic top circuit 202.

IO registers 211-222 are operable to transmit output signals to one or more external devices through pins 251-262, respectively. IO registers 211-222 are also operable to receive input signals from one or more external devices through pins 251-262, respectively. The output signals may be, for example, data signals (DQ) and a strobe signal (DQS-W) that are transmitted to an external memory device. The data signals may indicate data to be stored in the external memory device during a write operation. The input signals may be, for example, data signals (DQ) and a strobe signal (DQS) received from an external memory device. The data signals may indicate data accessed from the external memory device during a read operation. Pins 251-262 may be shared for read and write operations, if the read and write operations do not occur concurrently.

IO registers 211-222 include output registers that are operable to store the data indicated by the data signals DQ transmitted to the external memory device during each write operation in response to one or more of the clock signals CLK received from clock network 203. IO registers 211-222 include input registers that are operable to store the data indicated by the data signals DQ received from the external memory device during each read operation in response to a strobe signal DQS received from the external memory device. The data indicated by the data signals DQ that are stored in the input registers during each read operation may, for example, be provided to a read FIFO (first-in-first-out) buffer circuit in the memory interface. The read FIFO buffer circuit may store the data indicated by the data signals in response to one or more of the clock signals CLK received from clock network 203 and in response to the strobe signal DQS received from the external memory device.

DQS logic top circuit 202 generates the strobe signal DQS-W for each write operation in response to one or more of the clock signals CLK received from clock network 203. The strobe signal DQS-W is provided from DQS logic top circuit 202 to IO register 211 through a conductor. IO register 211 includes an output register that is operable to store the strobe signal DQS-W in response to one or more of the clock signals CLK received from clock network 203. Strobe signal DQS-W is transmitted to the external memory device during each write operation through pin 251. IO registers 211-222 may, for example, be operable to store and transmit the data signals and strobe signals at a double data rate.

LVDS-DPA circuits 231-236 are interface circuits. LVDS-DPA circuits 231-236 receive differential serial input signals from one or more external devices through pins 251-252, 253-254, 255-256, 257-258, 259-260, and 261-262, respectively. LVDS-DPA circuits 231-236 are operable to sample and deserialize bits indicated by the differential serial input signals in response to one or more of the clock signals CLK received from clock network 122/203. LVDS-DPA circuits 231-236 do not receive signals from or transmit signals to pins 251-262 at the same time as IO registers 211-222.

In an embodiment, each of the 6 LVDS-DPA circuits 231-236 includes a differential input buffer circuit, a dynamic phase alignment (DPA) circuit, and a deserializer circuit. If clock network 203 in FIG. 2 is an example of clock network 122, an N number of multi-phase clock signals that have phases separated by intervals of 360°/N are provided through conductors 241-246 in clock network 203 to each of the DPA circuits in circuits 231-236. For example, each DPA circuit in circuits 231-236 may receive 8 multi-phase clock signals (N=8) from clock network 203/122 that have relative phases of 0°, 45°, 90°, 135°, 180°, 225°, 270°, and 315°.

The differential input buffer circuits in LVDS-DPA circuits 231-236 are operable to buffer the differential serial input signals received at pins 251-262 to generate buffered serial signals that are provided to the DPA circuits. Each of the DPA circuits selects one of the multi-phase clock signals that has the optimal phase to sample one of the buffered serial signals in order to generate sampled serial bits. The maximum phase offset between the data indicated by the buffered serial signal and the selected phase is 1/N unit interval (UI), which is the maximum quantization error of the DPA circuit. The clock signal phase selected by each DPA circuit is provided to a respective one of the deserializer circuits. Each deserializer circuit converts the sampled serial bits generated by the respective DPA circuit into parallel bits in response to the clock signal phase selected by the respective DPA circuit. In some embodiments, each deserializer circuit may convert serial bits indicated by the buffered serial signal into parallel signals in response to one or more clock signals received directly from clock network 121 or 122. In some embodiments, the LVDS-DPA circuits 231-236 may synchronize serial input signals received at pins 251-262 with one or more clock signals received from clock network 121 or 122.

LVDS-DPA circuits 231-236 are also operable to serialize parallel signals to generate serial signals that are transmitted to one or more external devices through pins 251-252, 253-254, 255-256, 257-258, 259-260, and 261-262, respectively. Each of the LVDS-DPA circuits 231-236 includes a serializer circuit that samples bits in the parallel signals to generate bits in a serial signal in response to one, two, three, or more clock signals. These clock signals are provided to each of the serializer circuits through clock network 121. As mentioned above, clock network 203 shown in FIG. 2 is an example of a portion of the structure of clock network 121. A differential output buffer circuit in each of the LVDS-DPA circuits 231-236 buffers the respective serial signal to generate a buffered differential serial signal that is transmitted to an external device through a respective pair of pins 251-262.

FIG. 3 illustrates examples of clock networks that are operable to transmit clock signals between multiple input/output (IO) packs, according to an embodiment of the present invention. In the embodiment of FIG. 3, clock signals generated by a single CSGC can be provided to circuitry in IO lanes that are in three adjacent IO packs.

FIG. 3 illustrates portions of three IO packs 351-353. In an embodiment, each of IO packs 351-353 shown in FIG. 3 has the circuit structure shown in FIG. 1 in IO pack 100. In this embodiment, each of IO packs 351-353 has a CSGC 110, three multiplexers 111-113, four IO lanes 101-104, pins 106-107, clock networks 121-122, and conductors 131-136, as shown in FIG. 1. The IO lanes 101-104 in each of the IO packs 351-353 are not shown in FIG. 3 to simplify the drawing.

FIG. 3 illustrates three clock signal generation circuits (CSGCs) 301, 311, and 321, multiplexer circuits 302-303, 312-313, and 322-323, and conductors 331-335 and 341-346. Clock signal generation circuit (CSGC) 301 and multiplexer circuits 302-303 are in IO pack 351, CSGC 311 and multiplexer circuits 312-313 are in IO pack 352, and CSGC 321 and multiplexer circuits 322-323 are in IO pack 353.

CSGCs 301, 311, and 321 correspond to CSGC 110 in FIG. 1. Clock signal generation circuits (CSGCs) 301, 311, and 321 may be, for example, phase-locked loop circuits or delay-locked loop circuits. Multiplexer circuits 303, 313, and 323 correspond to multiplexer circuit 111 in FIG. 1. Multiplexer circuits 302, 312, and 322 may, for example, correspond to multiplexer circuit 112 in FIG. 1. Multiplexer circuit 113 and clock network 121 in each of IO packs 351-353 are not shown in FIG. 3.

In the embodiment of FIG. 3, CSGC 301 generates at least two clock signals CLKA1 and CLKA2. Clock signal CLKA1 is provided to a multiplexing input of multiplexer circuit 302. Clock signals CLKPQ1 are provided to additional multiplexing inputs of multiplexer circuit 302 from clock pins. Multiplexer circuit 302 selects clock signal CLKA1 or one of clock signals CLKPQ1 as a selected clock signal based on select signals B1 and provides the selected clock signal to its output as clock signal CLKB1.

CSGC 311 generates at least two clock signals CLKA3 and CLKA4. Clock signal CLKA3 is provided to a multiplexing input of multiplexer circuit 312. Clock signals CLKPQ2 are provided to additional multiplexing inputs of multiplexer circuit 312 from clock pins. Multiplexer circuit 312 selects clock signal CLKA3 or one of clock signals CLKPQ2 as a selected clock signal based on select signals B2 and provides the selected clock signal to its output as clock signal CLKB2.

CSGC 321 generates at least two clock signals CLKA5 and CLKA6. Clock signal CLKA5 is provided to a multiplexing input of multiplexer circuit 322. Clock signals CLKPQ3 are provided to additional multiplexing inputs of multiplexer circuit 322 from clock pins. Multiplexer circuit 322 selects clock signal CLKA5 or one of clock signals CLKPQ3 as a selected clock signal based on select signals B3 and provides the selected clock signal to its output as clock signal CLKB3.

Clock signals CLKB1 and CLKA2 are provided through conductors 332 and 344 to a first set of multiplexing inputs of multiplexer circuit 303 and through conductors 332 and 341 to a second set of multiplexing inputs of multiplexer circuit 303. Clock signals CLKG1 are provided from an adjacent IO pack (not shown) to a third set of multiplexing inputs of multiplexer circuit 303 through conductors 331. Clock signals CLKB2 and CLKA4 generated by CSGC 311 are provided to a fourth set of multiplexing inputs of multiplexer circuit 303 through conductors 333. Multiplexer circuit 303 selects the clock signals at its first set, second set, third set, or fourth set of multiplexing inputs as selected clock signals based on select signals C1 and provides the selected clock signals to its outputs as clock signals CLKC1. Clock signals CLKC1 are provided to IO lanes in IO pack 351 through its clock network 121, as described above with respect to FIG. 1.

Clock signals CLKB1 and CLKA2 are provided through conductors 332 to a first set of multiplexing inputs of multiplexer circuit 313. Clock signals CLKB2 and CLKA4 are provided through conductors 333 and 345 to a second set of multiplexing inputs of multiplexer circuit 313 and through conductors 333 and 342 to a third set of multiplexing inputs of multiplexer circuit 313. Clock signals CLKB3 and CLKA6 generated by CSGC 321 are provided through conductors 334 to a fourth set of multiplexing inputs of multiplexer circuit 313. Multiplexer circuit 313 selects the clock signals at its first set, second set, third set, or fourth set of multiplexing inputs as selected clock signals based on select signals C2 and provides the selected clock signals to its outputs as clock signals CLKC2. Clock signals CLKC2 are provided to IO lanes in IO pack 352 through its clock network 121, as described above with respect to FIG. 1.

Clock signals CLKB2 and CLKA4 are provided through conductors 333 to a first set of multiplexing inputs of multiplexer circuit 323. Clock signals CLKB3 and CLKA6 are provided through conductors 334 and 346 to a second set of multiplexing inputs of multiplexer circuit 323 and through conductors 334 and 343 to a third set of multiplexing inputs of multiplexer circuit 323. Clock signals CLKH1 are provided through conductors 335 from an adjacent IO pack (not shown) to a fourth set of multiplexing inputs of multiplexer circuit 323. Multiplexer circuit 323 selects the clock signals at its first set, second set, third set, or fourth set of multiplexing inputs as selected clock signals based on select signals C3 and provides the selected clock signals to its outputs as clock signals CLKC3. Clock signals CLKC3 are provided to IO lanes in IO pack 353 through its clock network 121, as described above with respect to FIG. 1.

In the embodiment of FIG. 3, two clock signals generated by one clock signal generation circuit (e.g., a PLL) can be provided to IO lanes in three adjacent IO packs. The embodiment of FIG. 3 allows the memory interfaces in the IO lanes in three adjacent IO packs to store and process signals transmitted to and from an external memory device, as described above with respect to FIG. 2, in response to clock signals generated by one CSGC. The embodiment of FIG. 3 also allows the LVDS-DPA circuits in three adjacent IO packs to serialize and deserialize signals transmitted to and from an external device, as described above with respect to FIG. 2, in response to clock signals generated by one CSGC.

For example, clock signals CLKB2 and CLKA4 can be provided through conductors 333 to multiplexing inputs of multiplexer circuits 303 and 323 and through conductors 333 and 342 to multiplexing inputs of multiplexer circuit 313. Multiplexer circuits 303, 313, and 323 can be configured by select signals C1, C2, and C3 to provide clock signals CLKB2 and CLKA4 to their outputs as clock signals CLKC1, CLKC2, and CLKC3, respectively. In this example, each of the three sets of clock signals CLKC1, CLKC2, and CLKC3 is generated based on clock signals CLKB2 and CLKA4. In this example, multiplexer circuit 313 is configured to select clock signals CLKB2 and CLKA4 from conductors 342 (instead of conductors 345) so that clock signals CLKC2 are aligned in phase with clock signals CLKC1 and CLKC3. Conductors 342 are longer than conductors 345, as shown in FIG. 3. Conductors 342 are about half the lengths of conductors 333, so that conductors 342 provide about the same delay to clock signals CLKB2 and CLKA4 as conductors 333.

As another example, each of clock signals CLKC1, clock signals CLKC2, and the clock signals provided to the IO lanes in an adjacent IO pack above IO pack 351 can be generated based on clock signals CLKB1 and CLKA2. In this example, multiplexer circuit 303 is configured to select clock signals CLKB1 and CLKA2 from conductors 341 (instead of conductors 344) so that clock signals CLKC1 are aligned in phase with clock signals CLKC2 and the clock signals provided to the IO lanes in the adjacent IO pack. Conductors 341 are longer than conductors 344, as shown in FIG. 3. Conductors 341 are about half the lengths of conductors 332, so that conductors 341 provide about the same delay to clock signals CLKB1 and CLKA2 as conductors 332.

As yet another example, each of clock signals CLKC2, clock signals CLKC3, and the clock signals provided to the IO lanes in an adjacent IO pack below IO pack 353 can be generated based on clock signals CLKB3 and CLKA6. In this example, multiplexer circuit 323 is configured to select clock signals CLKB3 and CLKA6 from conductors 343 (instead of conductors 346) so that clock signals CLKC3 are aligned in phase with clock signals CLKC2 and the clock signals provided to the IO lanes in the adjacent IO pack. Conductors 343 are longer than conductors 346, as shown in FIG. 3. Conductors 343 are about half the lengths of conductors 334, so that conductors 343 provide about the same delay to clock signals CLKB3 and CLKA6 as conductors 334.

Figure 4:
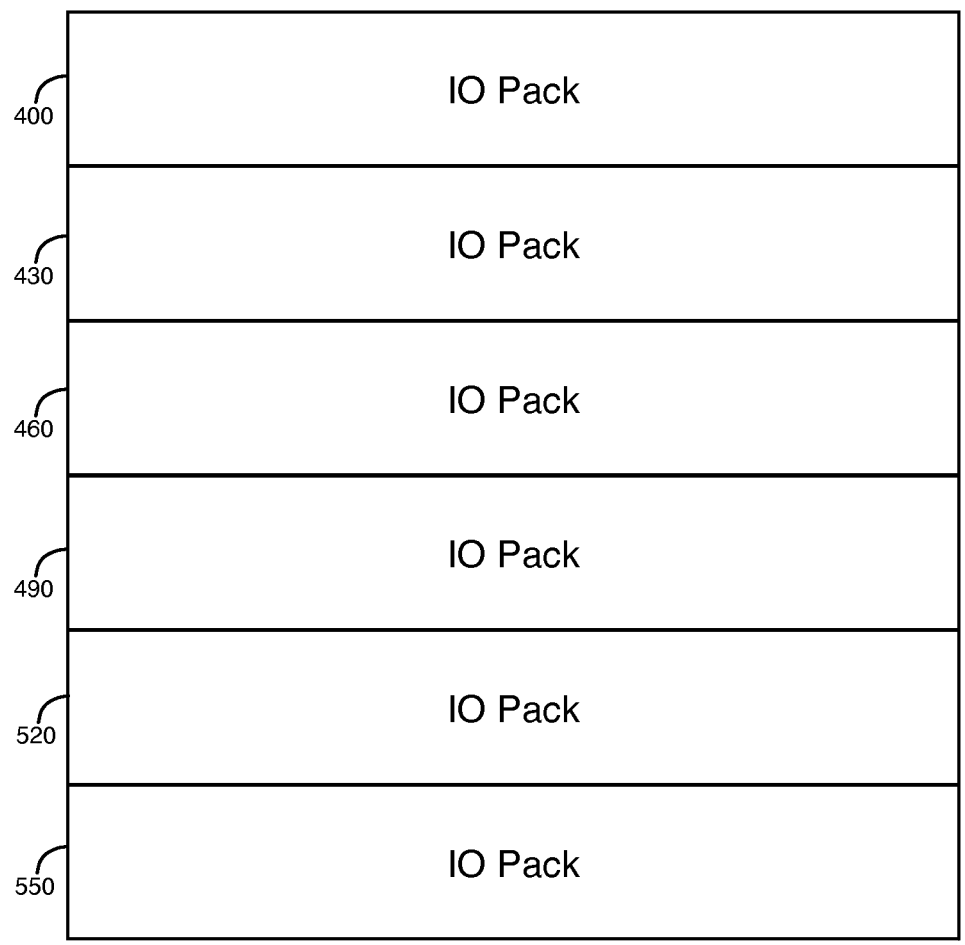
FIG. 4 illustrates six input/output (IO) packs, according to an embodiment of the present invention.

FIG. 4 illustrates six input/output (IO) packs 400, 430, 460, 490, 520, and 550, according to an embodiment of the present invention. IO packs 400, 430, 460, 490, 520, and 550 are next to each other. As shown in FIG. 4, IO pack 460 is adjacent to IO pack 490.

Figure 5A:
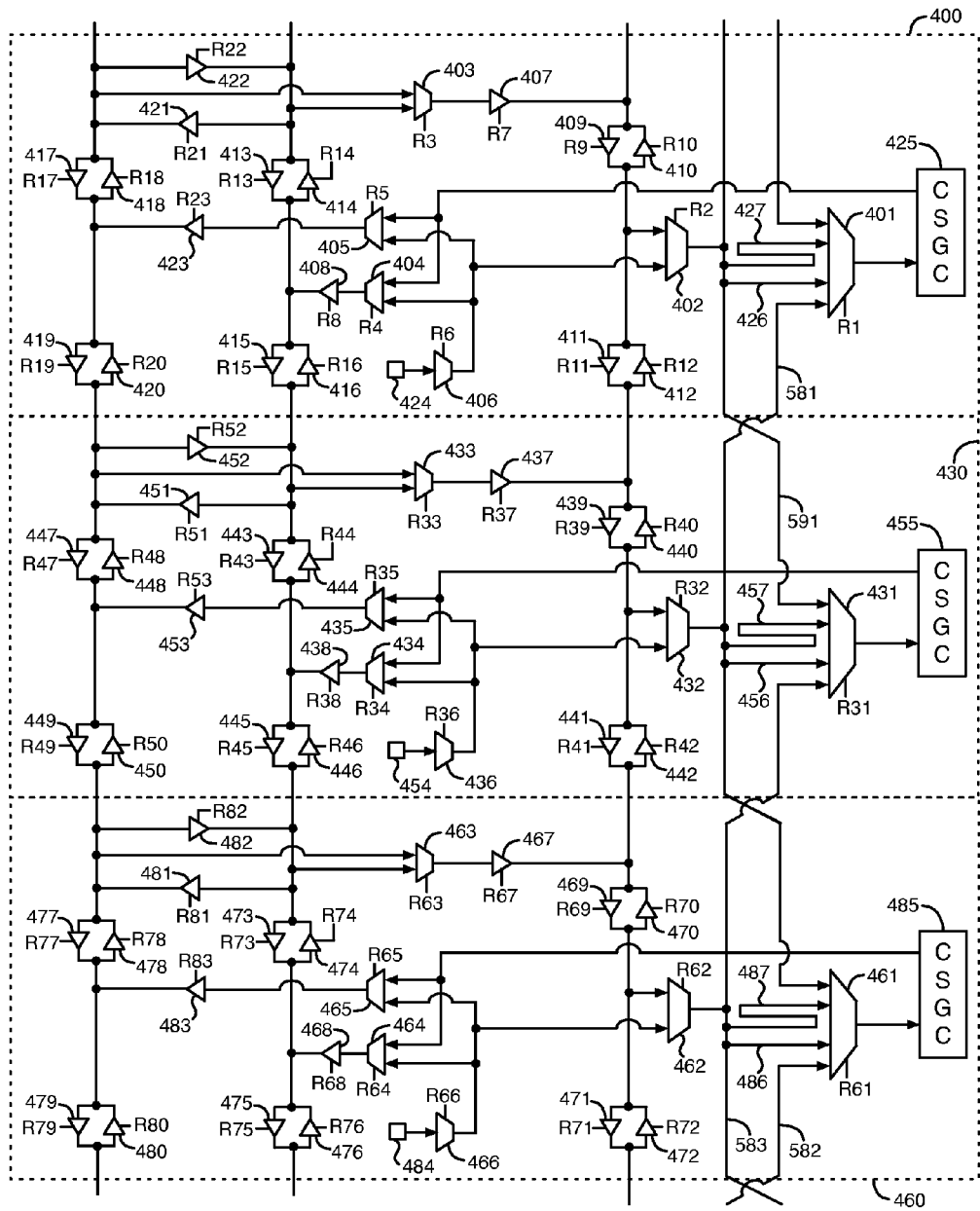
FIGS. 5A-5B illustrate additional details of the six input/output (IO) packs shown in FIG. 4, according to an embodiment of the present invention.
Figure 5B:
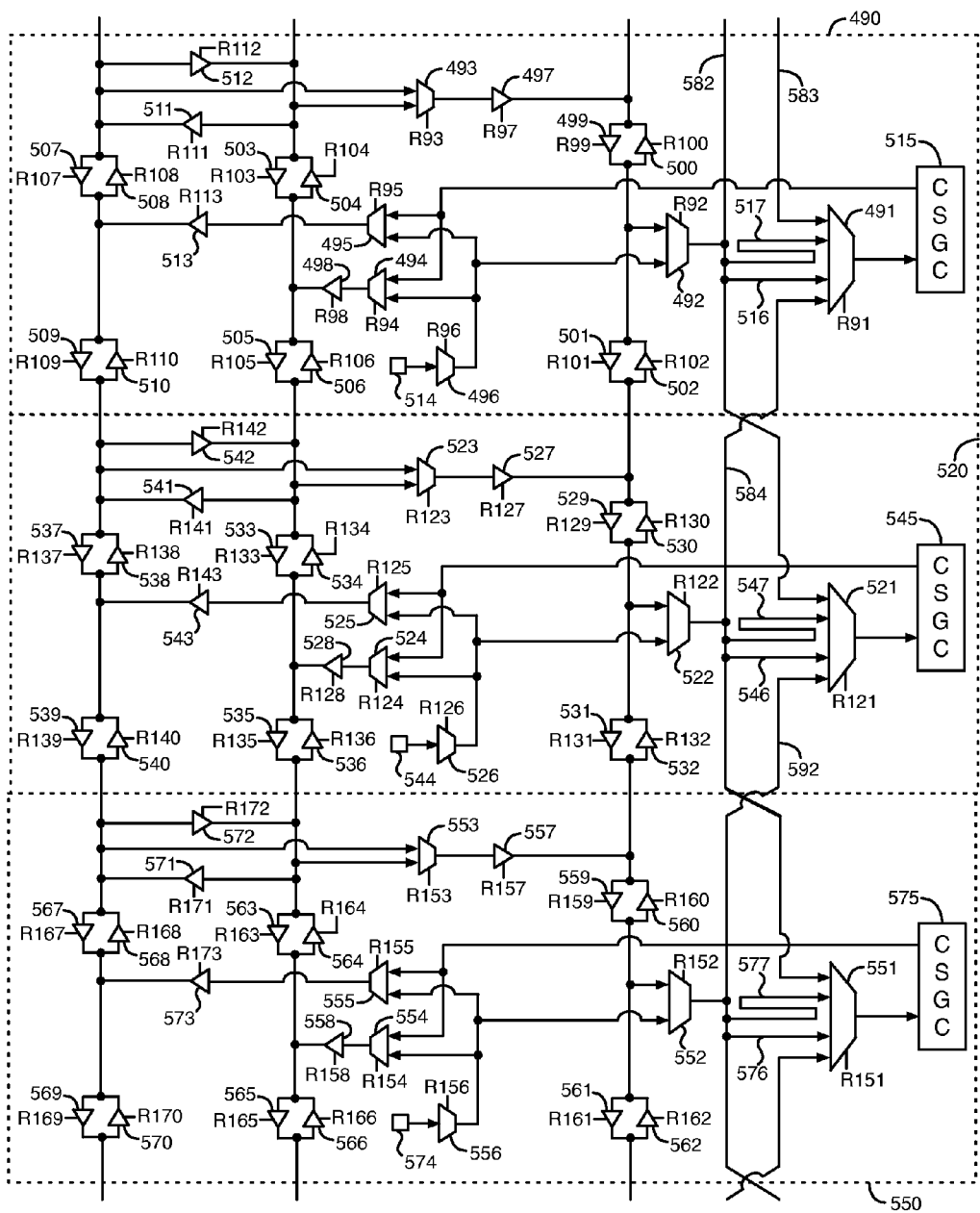

FIGS. 5A-5B illustrate additional details of the six input/output (IO) packs shown in FIG. 4, according to an embodiment of the present invention. FIG. 5A illustrates IO packs 400, 430, and 460. FIG. 5B illustrates IO packs 490, 520, and 550.

Referring to FIG. 5A, IO pack 400 includes clock signal generation circuit (CSGC) 425, multiplexer circuits 401-406, tristate buffer circuits 407-423, clock pin 424, conductors 426-427, and other conductors shown as solid black lines in FIG. 5A. IO pack 430 includes clock signal generation circuit (CSGC) 455, multiplexer circuits 431-436, tristate buffer circuits 437-453, clock pin 454, conductors 456-457, and other conductors shown as solid black lines in FIG. 5A. IO pack 460 includes clock signal generation circuit (CSGC) 485, multiplexer circuits 461-466, tristate buffer circuits 467-483, clock pin 484, conductors 486-487, and other conductors shown as solid black lines in FIG. 5A. A tristate buffer circuit is a buffer circuit that is enabled or disabled based on a control signal.

Referring to FIG. 5B, IO pack 490 includes clock signal generation circuit (CSGC) 515, multiplexer circuits 491-496, tristate buffer circuits 497-513, clock pin 514, conductors 516-517, and other conductors shown as solid black lines in FIG. 5B. IO pack 520 includes clock signal generation circuit (CSGC) 545, multiplexer circuits 521-526, tristate buffer circuits 527-543, clock pin 544, conductors 546-547, and other conductors shown as solid black lines in FIG. 5B. IO pack 550 includes clock signal generation circuit (CSGC) 575, multiplexer circuits 551-556, tristate buffer circuits 557-573, clock pin 574, conductors 576-577, and other conductors shown as solid black lines in FIG. 5B.

Multiplexer circuits 401-406, 431-436, 461-466, 491-496, 521-526, and 551-556 are configured by digital select signals R1-R6, R31-R36, R61-R66, R91-R96, R121-R126, and R151-R156, respectively. R1, R31, R61, R91, R121, and R151 are each a set of two select signals. Tristate buffer circuits 407-423, 437-453, 467-483, 497-513, 527-543, and 557-573 are enabled or disabled by digital control signals R7-R23, R37-R53, R67-R83, R97-R113, R127-R143, and R157-R173, respectively.

The conductors, multiplexers, and tristate buffer circuits shown in FIGS. 5A-5B are configurable to provide clock signals to inputs of clock signal generation circuits (CSGCs) 425, 455, 485, 515, 545, and 575. Clock signal generation circuits (CSGCs) 425, 455, 485, 515, 545, and 575 may be, for example, phase-locked loop circuits or delay-locked loop circuits. Clock signal generation circuits (CSGCs) 425, 455, 485, 515, 545, and 575 may, for example, use the clock signals received from the clock networks shown in FIGS. 5A-5B as reference clock signals. The reference clock signals are used to generate the output clock signals of the CSGCs, as described above. CSGC 100 shown in FIG. 1 corresponds to each of CSGCs 425, 455, 485, 515, 545, and 575 in the respective IO pack. The other circuitry shown in FIGS. 1-2 may be in each of IO packs 400, 430, 460, 490, 520, and 550.

In some embodiments, the circuitry shown in FIGS. 5A-5B is used to transmit a clock signal from a clock pin to inputs of three CSGCs in three adjacent IO packs. For example, multiplexer circuit 436, multiplexer circuit 432, and multiplexer circuit 431 can be configured by select signals R36, R32, and R31, respectively, to provide an input clock signal received at clock pin 454 in IO pack 430 to an input of CSGC 455. The clock signal received at clock pin 454 can also be provided through multiplexer circuits 436 and 432 and conductor 581 to multiplexing inputs of multiplexer circuits 401 and 461. Multiplexer circuits 401 and 461 can be configured by select signals R1 and R61 to provide the clock signal received from pin 454 to inputs of CSGCs 425 and 485, respectively. Thus, the clock signal received at clock pin 454 is provided to three CSGCs in three adjacent IO packs 400, 430, and 460 in this example. In this example, the clock signal received at clock pin 454 is provided from the output of multiplexer circuit 432 through conductor 457 to a multiplexing input of multiplexer circuit 431. Conductor 457 is about half the length of conductor 581, such that conductor 457 provides about the same delay to the clock signal as conductor 581. As a result, the clock signals as received at CSGCs 425, 455, and 485 from pin 454 are aligned in phase. Similarly, conductors 427, 487, 517, 547, and 577 are about half the lengths of conductors 591, 583, 582, 584, and 592, respectively.

As another example, an input clock signal received at clock pin 544 is provided to inputs of CSGCs 515, 545, and 575 in IO packs 490, 520, and 550, respectively, through multiplexer circuits 526, 522, 521, 491, and 551 and conductors 584 and 547. As yet another example, an input clock signal received at clock pin 514 is provided to inputs of CSGCs 485, 515, and 545 in IO packs 460, 490, and 520, respectively, through multiplexer circuits 496, 492, 491, 521, and 461 and conductors 582 and 517. Conductor 582 is coupled to multiplexing inputs of multiplexer circuits 461, 491, and 521. As yet another example, an input clock signal received at clock pin 484 is provided to inputs of CSGCs 455, 485, and 515 in IO packs 430, 460, and 490, respectively, through multiplexer circuits 466, 462, 461, 431, and 491 and conductors 583 and 487. Conductor 583 is coupled to multiplexing inputs of multiplexer circuits 431, 461, and 491. Conductor 487 provides about the same delay to the clock signal as conductor 583. Therefore, the clock signal received at the three CSGCs from the same clock pin are aligned in phase, because the circuit paths providing the clock signal have the same delay.

The IO packs in FIGS. 5A-5B include three bidirectional clock networks. The first bidirectional clock network includes tristate buffer circuits 417-420, 447-450, 477-480, 507-510, 537-540, and 567-570. Tristate buffer circuits 479-480 are coupled to tristate buffer circuits 507-508. The second bidirectional clock network includes tristate buffer circuits 413-416, 443-446, 473-476, 503-506, 533-536, and 563-566. Tristate buffer circuits 475-476 are coupled to tristate buffer circuits 503-504. The third bidirectional clock network includes tristate buffer circuits 409-412, 439-442, 469-472, 499-502, 529-532, and 559-562. Tristate buffer circuits 471-472 are coupled to tristate buffer circuits 499-500.

Each of the three bidirectional clock networks are configurable to be subdivided into two or more segments by turning off two cross-coupled tristate buffer circuits in the bidirectional clock network. For example, the first bidirectional clock network can be subdivided into two segments by disabling both of cross-coupled tristate buffer circuits 479-480. In this example, the first segment includes tristate buffer circuits 417-420, 447-450, and 477-478, and the second segment includes tristate buffer circuits 507-510, 537-540, and 567-570. The first and second segments can drive a signal up or down with respect to the orientation shown in FIGS. 5A-5B within the respective segment by enabling and disabling corresponding ones of the tristate buffer circuits.

A clock signal received at a clock pin may also be provided to CSGCs in two or more of the IO packs through one or more of the bidirectional clock networks. In an embodiment, a clock signal received at a clock pin is provided to two CSGCs in two separate IO packs through the first and the third bidirectional clock networks. As a specific example, multiplexer circuits 466 and 465 are configured by select signals R66 and R65, respectively, to provide a clock signal received at pin 484 to the input of tristate buffer circuit 483. Tristate buffer circuits 483 and 478 are enabled by control signals R83 and R78, respectively, to provide the clock signal to a multiplexing input of multiplexer circuit 463. Tristate buffer circuits 477, 449, and 480 are disabled by control signals R77, R49, and R80, respectively. Multiplexer circuit 463 is configured by select signal R63 to provide the clock signal from the first bidirectional clock network to the input of tristate buffer circuit 467.

Tristate buffer circuits 467, 442, 440, and 412 are enabled by control signals R67, R42, R40, and R12, respectively, to provide the clock signal to a multiplexing input of multiplexer circuit 402. Multiplexer circuits 402 and 401 are configured by select signals R2 and R1, respectively, to provide the clock signal to CSGC 425 through conductor 426. Tristate buffer circuits 441, 439, and 411 are disabled by control signals R41, R39, and R11, respectively.

Tristate buffer circuits 467, 469, 471, and 499 are enabled by control signals R67, R69, R71, and R99, respectively, to provide the clock signal to a multiplexing input of multiplexer circuit 492. Multiplexer circuits 492 and 491 are configured by select signals R92 and R91, respectively, to provide the clock signal to CSGC 515 through conductor 516. Conductor 516 has the same length as conductor 426. Tristate buffer circuits 470, 472, and 500 are disabled by control signals R70, R72, and R100, respectively.

In this example, the circuit path from tristate buffer circuit 467 through circuits 442, 440, 412, 402, and 401 and conductor 426 provides the same delay to the clock signal as the circuit path from tristate buffer circuit 467 through circuits 469, 471, 499, 492, and 491 and conductor 516. As a result, the clock signal received at CSGC 425 from pin 484 is aligned in phase with the clock signal received at CSGC 515 from pin 484.

According to an alternative embodiment, a clock signal received at a clock pin is provided to two CSGCs in two separate IO packs through the second and the third bidirectional clock networks. As a specific example, multiplexer circuits 466 and 464 are configured by select signals R66 and R64, respectively, to provide a clock signal received at pin 484 to the input of tristate buffer circuit 468. Tristate buffer circuits 468 and 474 are enabled by control signals R68 and R74, respectively, to provide the clock signal to a multiplexing input of multiplexer circuit 463. Tristate buffer circuits 473, 476, and 445 are disabled by control signals R73, R76, and R45, respectively. Multiplexer circuit 463 is configured by select signal R63 to provide the clock signal from the second bidirectional clock network to the input of tristate buffer circuit 467. The clock signal is then provided to CSGCs 425 and 515 as described above.

As another example, a clock signal received at clock pin 484 is provided to CSGCs 455 and 485 through the first or the second bidirectional clock network and through the third bidirectional clock network. In this example, the clock signal is provided from tristate buffer circuit 467 through tristate buffer circuit 442 and multiplexer circuits 432 and 431 and conductor 456 to CSGC 455. The clock signal is also provided from tristate buffer circuit 467 through tristate buffer circuit 469 and multiplexer circuits 462 and 461 and conductor 486 to CSGC 485. The clock signal received at CSGC 455 from pin 484 is aligned in phase with the clock signal received at CSGC 485 from pin 484, because the clock signal is provided through circuit paths that have the same delays.

According to various embodiments, a clock signal received at any one of clock pins 424, 454, 484, 514, 544, and 574 can be provided through the first or second bidirectional clock network and the third bidirectional clock network to two CSGCs in two different IO packs. A clock signal received at any one of clock pins 424, 454, 484, 514, 544, or 574 can be provided to the third bidirectional clock network through any one of tristate buffer circuits 407, 437, 467, 497, 527, or 557. The clock signal is provided to two CSGCs in two different IO packs through segments of the third bidirectional clock network that have the same delay. As a result, the clock signal received at one CSGC is aligned in phase with the clock signal received at the other CSGC.

As yet another example, a clock signal at the output of tristate buffer circuit 497 can be provided to CSGC 455 through tristate buffer circuits 472, 470, and 442, multiplexer circuits 432 and 431, and conductor 456. The clock signal at the output of tristate buffer circuit 497 can be provided to CSGC 545 through tristate buffer circuits 499, 501, 529, multiplexer circuits 522 and 521, and conductor 546.

Multiplexer circuits 404, 434, 464, 494, 524, and 554 are configurable by their respective select signals to provide output clock signals from CSGCs 425, 455, 485, 515, 545, and 575, respectively, to the second bidirectional clock network. Multiplexer circuits 405, 435, 465, 495, 525, and 555 are configurable by their respective select signals to provide output clock signals from CSGCs 425, 455, 485, 515, 545, and 575, respectively, to the first bidirectional clock network.

According to some embodiments, a method comprises generating a first clock signal using a first clock signal generation circuit; generating a second clock signal using a second clock signal generation circuit; and generating a third clock signal using a third clock signal generation circuit. First interface circuits are coupled to first pins, second interface circuits are coupled to second pins, and third interface circuits are coupled to third pins. The method further comprises receiving the first and the second clock signals at inputs of a first multiplexer circuit and providing one of the first and the second clock signals to the first interface circuits through a first clock network; receiving the first, the second, and the third clock signals at inputs of a second multiplexer circuit and providing one of the first, the second, and the third clock signals to the second interface circuits through a second clock network; and receiving the second and the third clock signals at inputs of a third multiplexer circuit and providing one of the second and the third clock signals to the third interface circuits through a third clock network.

Figure 6:
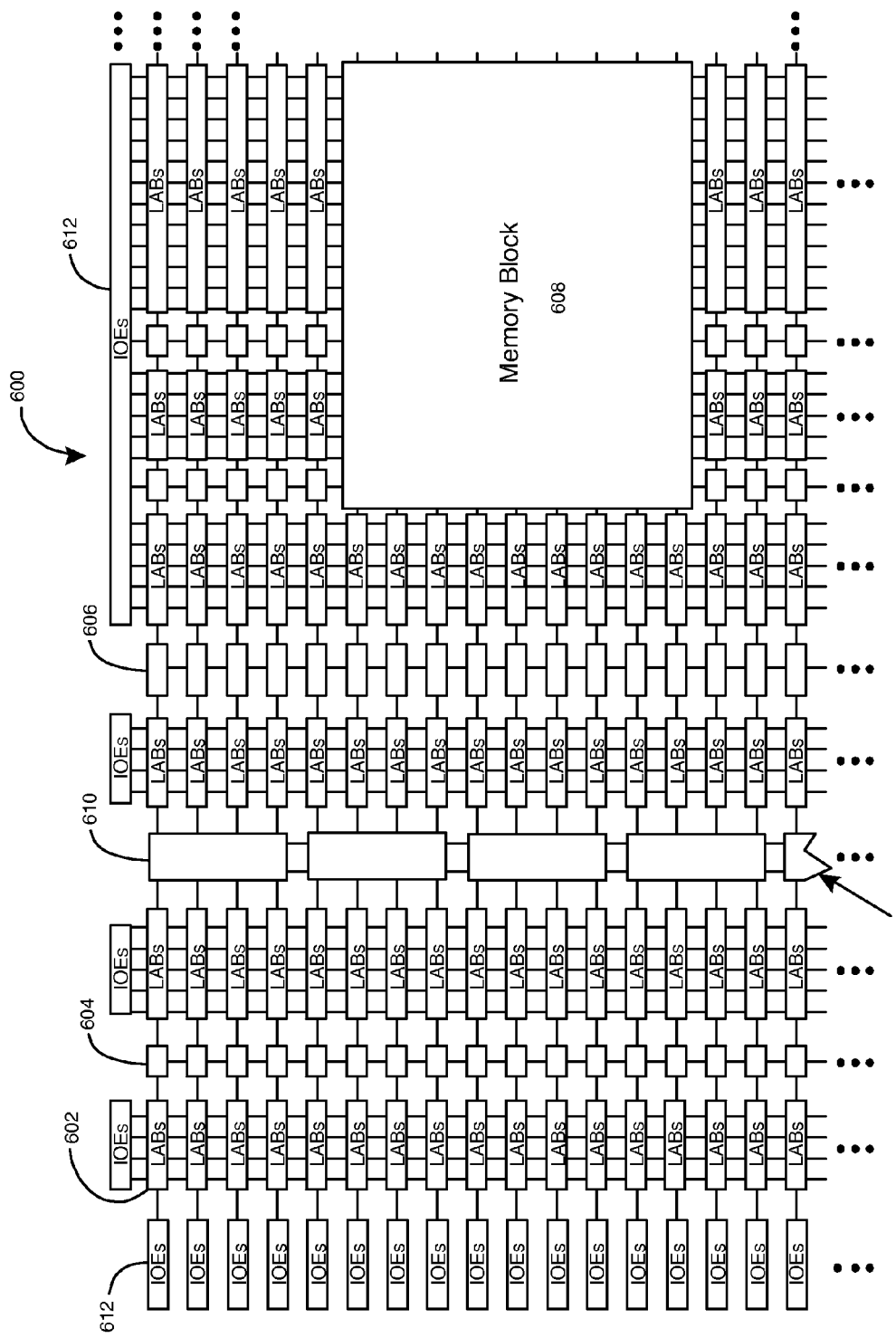
FIG. 6 is a simplified partial block diagram of a field programmable gate array (FPGA) that can include aspects of the present invention.

FIG. 6 is a simplified partial block diagram of a field programmable gate array (FPGA) 600 that can include aspects of the present invention. FPGA 600 is merely one example of an integrated circuit that can include features of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), application specific integrated circuits (ASICs), memory integrated circuits, central processing units, microprocessors, analog integrated circuits, etc.

FPGA 600 includes a two-dimensional array of programmable logic array blocks (or LABs) 602 that are interconnected by a network of column and row interconnect conductors of varying length and speed. LABs 602 include multiple (e.g., 10) logic elements (or LEs).

A logic element (LE) is a programmable logic circuit block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 600 also includes a distributed memory structure including random access memory (RAM) blocks of varying sizes provided throughout the array. The RAM blocks include, for example, blocks 604, blocks 606, and block 608. These memory blocks can also include shift registers and first-in-first-out (FIFO) buffers.

FPGA 600 further includes digital signal processing (DSP) blocks 610 that can implement, for example, multipliers with add or subtract features. Input/output elements (IOEs) 612 support numerous single-ended and differential input/output standards. IOEs 612 include input and output buffers that are coupled to pins of the integrated circuit. The pins are external terminals of the FPGA die that can be used to route, for example, input signals, output signals, and supply voltages between the FPGA and one or more external devices. One or more of IOEs 612 may include one or multiple input/output (IO) packs as shown, for example, in FIGS. 1-5B. FPGA 600 is described herein for illustrative purposes. Embodiments of the present invention can be implemented in many different types of integrated circuits.

Figure 7:
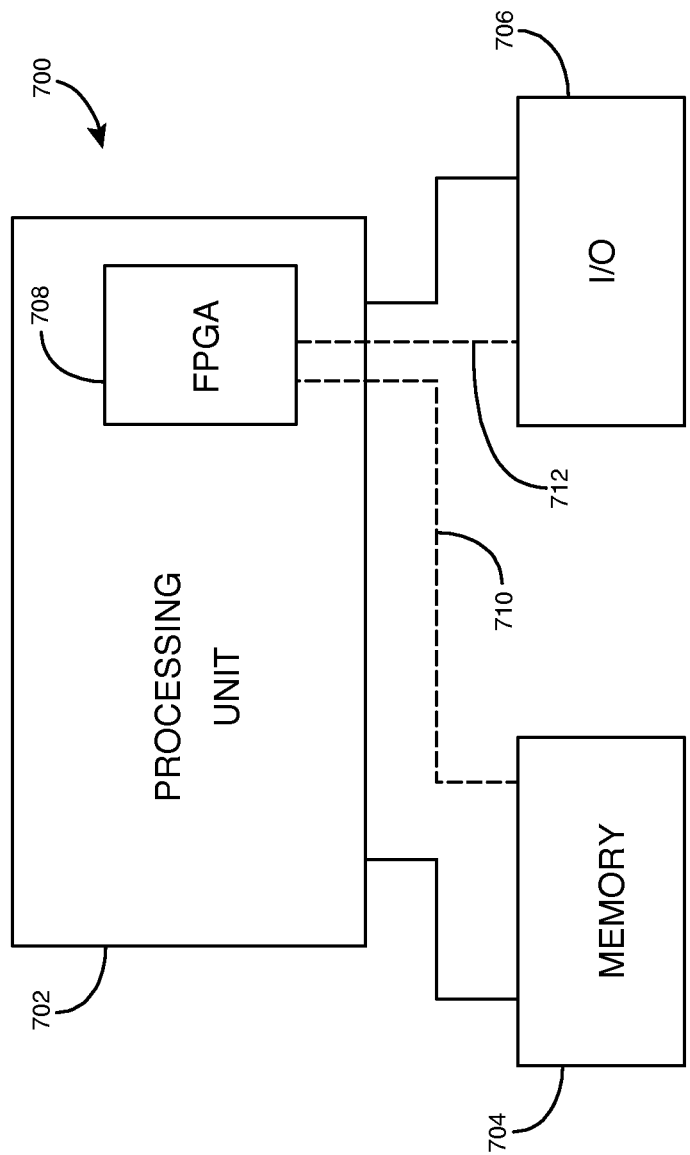
FIG. 7 shows a block diagram of an exemplary digital system that can embody techniques of the present invention.

The present invention can also be implemented in a system that has an FPGA as one of several components. FIG. 7 shows a block diagram of an exemplary digital system 700 that can embody techniques of the present invention. System 700 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 700 can be provided on a single board, on multiple boards, or within multiple enclosures.

System 700 includes a processing unit 702, a memory unit 704, and an input/output (I/O) unit 706 interconnected together by one or more buses. According to this exemplary embodiment, an FPGA 708 is embedded in processing unit 702. FPGA 708 can serve many different purposes within the system of FIG. 7. FPGA 708 can, for example, be a logical building block of processing unit 702, supporting its internal and external operations. FPGA 708 is programmed to implement the logical functions necessary to carry on its particular role in system operation. FPGA 708 can be specially coupled to memory 704 through connection 710 and to I/O unit 706 through connection 712.

Processing unit 702 can direct data to an appropriate system component for processing or storage, execute a program stored in memory 704, receive and transmit data via I/O unit 706, or other similar functions. Processing unit 702 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 708 can control the logical operations of the system. As another example, FPGA 708 acts as a reconfigurable processor that can be reprogrammed as needed to handle a particular computing task. Alternatively, FPGA 708 can itself include an embedded microprocessor. Memory unit 704 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A circuit comprising:
 first and second bidirectional clock networks;
 a first multiplexer circuit configurable to provide a first clock signal from a first pin to the first bidirectional clock network;
 a second multiplexer circuit configurable to provide the first clock signal from the first bidirectional clock network to the second bidirectional clock network;
 first and second clock signal generation circuits; and
 third multiplexer circuits configurable to provide the first clock signal from the second bidirectional clock network to the first and the second clock signal generation circuits.

2. The circuit of claim 1, further comprising:
 a third clock signal generation circuit, wherein one of the third multiplexer circuits is configurable to provide the first clock signal from the second bidirectional clock network to the third clock signal generation circuit.

3. The circuit of claim 2, wherein the second bidirectional clock network and the third multiplexer circuits are configurable to provide substantially the same delay to the first clock signal as the first clock signal is transmitted to each of the first, the second, and the third clock signal generation circuits.

4. The circuit of claim 1, further comprising:
 a third bidirectional clock network;
 a fourth multiplexer circuit configurable to provide a second clock signal from a second pin to the third bidirectional clock network, wherein the first clock signal is provided through a first segment of the second bidirectional clock network;
 a fifth multiplexer circuit configurable to provide the second clock signal from the third bidirectional clock network to a second segment of the second bidirectional clock network;
 third and fourth clock signal generation circuits; and
 sixth multiplexer circuits configurable to provide the second clock signal from the second segment of the second bidirectional clock network to the third and the fourth clock signal generation circuits.

5. The circuit of claim 4, further comprising:
 a fifth clock signal generation circuit, wherein one of the sixth multiplexer circuits is configurable to provide the second clock signal from the second segment of the second bidirectional clock network to the fifth clock signal generation circuit, and wherein the second bidirectional clock network and the sixth multiplexer circuits are configurable to provide substantially the same delay to the second clock signal as the second clock signal is transmitted to each of the third, the fourth, and the fifth clock signal generation circuits.

6. The circuit of claim 1, further comprising:
 a first interface circuit coupled to second pins;
 a second interface circuit coupled to third pins, wherein the first clock signal generation circuit generates a second clock signal based on the first clock signal; and
 a first unidirectional clock network configurable to provide the second clock signal to the first and the second interface circuits, wherein the first unidirectional clock network provides substantially the same delay to the second clock signal as the second clock signal is transmitted to each of the first and the second interface circuits.

7. The circuit of claim 6, further comprising:
 a third interface circuit coupled to fourth pins;
 a fourth interface circuit coupled to fifth pins, wherein the second clock signal generation circuit generates a third clock signal based on the first clock signal; and
 a second unidirectional clock network configurable to provide the third clock signal to the third and the fourth interface circuits, wherein the second unidirectional clock network provides substantially the same delay to the third clock signal as the third clock signal is transmitted to each of the third and the fourth interface circuits.

8. The circuit of claim 7, wherein the first, the second, the third, and the fourth interface circuits are memory interface circuits, wherein the circuit is in an integrated circuit, and wherein the first and the second clock signal generation circuits are phase-locked loop circuits.

9. A circuit comprising:
 a first clock signal generation circuit to generate a first clock signal;

a second clock signal generation circuit to generate a second clock signal;
a third clock signal generation circuit to generate a third clock signal;
first interface circuits coupled to first pins;
second interface circuits coupled to second pins;
first and second clock networks;
a first multiplexer circuit to receive the first and the second clock signals and to provide one of the first and the second clock signals to the first interface circuits through the first clock network; and
a second multiplexer circuit to receive the first, the second, and the third clock signals and to provide one of the first, the second, and the third clock signals to the second interface circuits through the second clock network.

10. The circuit of claim 9, further comprising:
a third clock network;
third interface circuits coupled to third pins; and
a third multiplexer circuit to receive the second and the third clock signals and to provide one of the second and the third clock signals to the third interface circuits through the third clock network.

11. The circuit of claim 10, further comprising:
conductors to provide the second clock signal to the first, the second, and the third multiplexer circuits, wherein the conductors provide substantially the same delay to the second clock signal as the second clock signal is transmitted to each of the first, the second, and the third multiplexer circuits.

12. The circuit of claim 10, further comprising:
first and second bidirectional clock networks;
a fourth multiplexer circuit to provide a fourth clock signal from a fourth pin to the first bidirectional clock network;
a fifth multiplexer circuit to provide the fourth clock signal from the first bidirectional clock network to a segment of the second bidirectional clock network; and
sixth multiplexer circuits to provide the fourth clock signal from the second bidirectional clock network to the first, the second, and the third clock signal generation circuits.

13. The circuit of claim 9, wherein the first clock network is coupled to the first clock signal generation circuit, and wherein the first clock signal generation circuit generates the first clock signal based on a feedback clock signal received from the first clock network.

14. The circuit of claim 10, further comprising:
a fourth multiplexer circuit to receive the first clock signal and a fourth clock signal from a fourth pin, wherein the fourth multiplexer circuit provides one of the first and the fourth clock signals to the first and the second multiplexer circuits; and
a fifth multiplexer circuit to receive the second clock signal and a fifth clock signal from a fifth pin, wherein the fifth multiplexer circuit provides one of the second and the fifth clock signals to the first and the second multiplexer circuits.

15. The circuit of claim 10, wherein each of the first, the second, and the third clock signal generation circuits is a phase-locked loop circuit, and the first, the second, and the third interface circuits are memory interface circuits.

16. The circuit of claim 10, further comprising:
fourth and fifth clock networks;
a fourth multiplexer circuit to provide a fourth clock signal generated by the first clock signal generation circuit to the first interface circuits through the fourth clock network; and
a fifth multiplexer circuit to provide a fifth clock signal generated by the second clock signal generation circuit to the second interface circuits through the fifth clock network.

17. A method comprising:
providing a first clock signal from a first pin to a first bidirectional clock network through a first multiplexer circuit;
providing the first clock signal from the first bidirectional clock network to a second bidirectional clock network through a second multiplexer circuit;
providing the first clock signal from the second bidirectional clock network to a first clock signal generation circuit through a third multiplexer circuit; and
providing the first clock signal from the second bidirectional clock network to a second clock signal generation circuit through a fourth multiplexer circuit.

18. The method of claim 17, further comprising:
providing the first clock signal from the second bidirectional clock network to a third clock signal generation circuit through a fifth multiplexer circuit.

19. The method of claim 18, wherein the second bidirectional clock network and the third, the fourth, and the fifth multiplexer circuits are configurable to provide substantially the same delay to the first clock signal as the first clock signal is transmitted to each of the first, the second, and the third clock signal generation circuits.

20. The method of claim 17, further comprising:
providing a second clock signal from a second pin to a third bidirectional clock network through a fifth multiplexer circuit, wherein the first clock signal is provided through a first segment of the second bidirectional clock network;
providing the second clock signal from the third bidirectional clock network to a second segment of the second bidirectional clock network through a sixth multiplexer circuit;
providing the second clock signal from the second segment of the second bidirectional clock network through a seventh multiplexer circuit to a third clock signal generation circuit; and
providing the second clock signal from the second segment of the second bidirectional clock network through an eighth multiplexer circuit to a fourth clock signal generation circuit.

21. The method of claim 20, further comprising:
providing the second clock signal from the second segment of the second bidirectional clock network through a ninth multiplexer circuit to a fifth clock signal generation circuit, wherein the second bidirectional clock network and the seventh, the eighth, and the ninth multiplexer circuits are configurable to provide substantially the same delay to the second clock signal as the second clock signal is transmitted to each of the third, the fourth, and the fifth clock signal generation circuits.

* * * * *